United States Patent
Ohnaka et al.

(10) Patent No.: US 6,618,447 B1
(45) Date of Patent: Sep. 9, 2003

(54) MULTIPLE SIGNAL PROCESSING UNIT FOR UTILITY WIRING BY RECEIVER/LAN AND UTILITY WIRING SYSTEM BY RECEIVER/LAN

(76) Inventors: Tadao Ohnaka, Lions Mansion Mukomachi No. 802, 557, Ohyabu-cho, Kuze, Minami-ku, Kyoto-shi, Kyoto 601-8206 (JP); Tetsuo Kawashima, 15-15, Ohginosato 2-chome, Ohtsu-shi, Shiga 520-0246 (JP); Kensaku Naito, Mibu Bojo Danchi No. 713, 19-4, Mibu Bojo-cho, Nakagyo-ku, Kyoto-shi, Kyoto 604-8804 (JP)

( * ) Notice: Subject to any disclaimer, the term of this patent is extended or adjusted under 35 U.S.C. 154(b) by 0 days.

(21) Appl. No.: 09/147,884
(22) PCT Filed: Sep. 11, 1997
(86) PCT No.: PCT/JP97/03202
§ 371 (c)(1), (2), (4) Date: Mar. 19, 1999
(87) PCT Pub. No.: WO98/12838
PCT Pub. Date: Mar. 26, 1998

(30) Foreign Application Priority Data

Sep. 20, 1996 (JP) .............................................. 8-285785
Sep. 20, 1996 (JP) .............................................. 8-285786

(51) Int. Cl.$^7$ .......................... H04L 12/18; H04N 7/10; H04N 7/16
(52) U.S. Cl. .................................................... 375/257
(58) Field of Search ........................... 375/257; 710/29, 710/1, 18, 36, 37; 340/286.02, 855.4, 855.5, 855.7; 709/100, 208, 232, 234; 377/61; 370/229, 235, 910, 908; 395/856; 379/399; 327/61, 386, 519

(56) References Cited

U.S. PATENT DOCUMENTS

| | | | | |
|---|---|---|---|---|
| 4,689,620 A | * | 8/1987 | Wondrak | 340/856 |
| 5,483,640 A | * | 1/1996 | Isfeld et al. | 395/200.03 |
| 5,661,754 A | * | 8/1997 | Mapleston | 375/239 |
| 5,804,993 A | * | 9/1998 | Suzuki | 327/58 |

FOREIGN PATENT DOCUMENTS

| | | | | |
|---|---|---|---|---|
| JP | 47-23107 | | 10/1972 | |
| JP | 62-65-539 | | 3/1987 | ........... H04L/11/00 |
| JP | 64-47191 | * | 2/1989 | ........... H04N/7/173 |
| JP | 64-62935 | | 3/1989 | ........... H04L/11/00 |
| JP | 3-46846 | | 2/1991 | ........... H04L/12/40 |

* cited by examiner

Primary Examiner—Don N. Vo
Assistant Examiner—Dung X. Nguyen
(74) Attorney, Agent, or Firm—Armstrong, Westerman & Hattori, LLP

(57) ABSTRACT

A unit which processes multiple signals transmitted through utility wiring by receiver/LAN has a utility wiring connecting terminal (10) connected to the utility wiring by receiver/LAN, at least one input-output terminal for connecting computer (11) connected to the terminal (10), and at least one input-output terminal for connecting receiver (12) connected to the terminal (10). First signal interference preventing circuits (13 and 19) are respectively connected between the terminal (10) and the input-output terminal (12) so as to check the reverse flow of LAN signals. Therefore, signals for a television receiver, etc., and LAN signals can be transmitted through a coaxial cable for television, etc., wired in an already existing building without causing interference between the signals.

6 Claims, 4 Drawing Sheets

MULTIPLE SIGNAL PROCESSING UNIT FOR UTILITY WIRING BY RECEIVER/LAN AND UTILITY WIRING SYSTEM BY RECEIVER/LAN

This application is a national stage filing of PCT application S/N PCT/JP97/03202, filed in Japan on Sep. 11, 1997.

TECHNICAL FIELD

The present invention relates to a multiple signal processing unit for utility wiring by receiver/LAN and a utility wiring system by receiver/LAN.

Herein, the receiver means equipment having a function by which a signal can be received from an input terminal. For example, the receiver includes the receiver such as a television, CATV, cable broadcasting, FM broadcasting and in-building broadcasting; and a transmitter/receiver such as a telephone, security communication equipment and an interphone. LAN means a local area network of computers. The utility wiring by receiver/LAN means the utility wiring which is used not only for the receiver but also for LAN. The multiple signal means the signal comprising a mix of signals received by the receiver such as the television and the telephone and LAN signal.

BACKGROUND ART

A coaxial cable or a twisted-pair cable is installed for a receiver only inside a building such as an existing office building. For example, television broadcasting, cable broadcasting, FM broadcasting or the like is received in the following manner. A common receiving antenna is installed in place. A signal received by the receiving antenna is distributed to rooms through the twisted-pair cable or the coaxial cable. The broadcasting is received by the receiver connected to a terminal of the cable in each room.

In this case, VHF, UHF, BS, SHF, CS or the like is used as a television signal. A frequency band of from 90 MHz to 1.8 GHz is sequentially used. The frequency band of from 76 MHz to 90 MHz is used for the FM broadcasting. The frequency band of from 30 MHz to 90 MHz is used for the cable broadcasting.

The coaxial cable or the twisted-pair cable is separately used so that various signals may be assigned to the cable in accordance with the frequency.

On the other hand, LAN for connecting computers in the building through a communication line installed in the building has been recently spread rapidly. LAN has standards such as Ethernet (IEEE Standard 802.3), IBM Token ring and Apple talk. Ethernet standard is the most popular of these standards of LAN. A frequency range of 5 MHz or more can be used for the transmission of LAN signal. Mainly, the frequency range of 5 MHz, 10 MHz and 20 MHz is used in general.

A wiring of the communication line for LAN is installed independently of the wiring of the cable for the television or the like. A new wiring work is required for the existing building. A problem arises: the work is not easy and extends over a long period, thereby resulting in a high cost. Another problem arises: the new wiring work is, in fact, difficult for the existing building and consequently LAN cannot be constructed.

It is very advantageous in aspects of the work operation, the construction period and the cost to be capable of using as the cable for LAN the cable for the receiver only such as the television and the cable broadcasting which is already installed in the building. In addition to the above advantage, it has another advantage: the installation of the cable for the television etc. permits the construction of LAN even in an area in which LAN cannot be, in fact, constructed.

However, this has a disadvantage as described below. Although the frequency used for the television signal or the like does not overlap with the frequency used for the LAN signal, the frequency used for the signal output from the computer is not always within a range of the frequency used for the LAN signal. Moreover, various receivers are not designed on the assumption that they are used simultaneously with the computer. As a result, the receiver and the computer do not normally operate only by connecting the computer to the cable for the receiver only such as the television, thereby causing a serious trouble.

An object of the present invention is to permit simultaneously transmitting the signal received by the receiver such as the television and the cable broadcasting and the LAN signal through a single cable without causing interference between the signals, thereby to enable LAN to be constructed by means of cables for the television and the cable broadcasting installed in a building.

DISCLOSURE OF THE INVENTION

The above object is achieved by the present invention: a unit for processing a multiple signal transmitted through utility wiring by receiver/LAN, which comprises a pair of utility wiring connecting terminals connected with each other for connecting to the utility wiring; at least one input-output terminal for connecting a computer, the input-output terminal being connected to the utility wiring connecting terminals; at least one input-output terminal for connecting the receiver, the input-output terminal being connected to the utility wiring connecting terminals; and a first signal interference preventing circuit for preventing a reverse flow of LAN signal, the circuit being connected between the utility wiring connecting terminals and each input-output terminal for connecting the receiver.

Preferably, the unit comprises a second signal interference preventing circuit for preventing an interference of the LAN signal output from the computer, the circuit being connected between the utility wiring connecting terminals and each input-output terminal for connecting the computer.

Preferably, the first signal interference preventing circuit comprises a high-pass filter having a cut-off frequency which is within a range of from 76 MHz to 10 MHz. Alternatively, the first signal interference preventing circuit comprises a diode or a capacitor. Preferably, the second signal interference preventing circuit comprises a low-pass filter having a cut-off frequency which is within a range of from 70 MHz to 10 MHz.

Preferably, the input-output terminal for connecting the computer comprises any one of T-type, 2-type, 5-type and F-type Ethernet connectors or a combination of these connectors.

The above object is achieved by the present invention: a utility wiring system by receiver/LAN, which comprises a utility wiring by receiver/LAN; at least one booster located in the utility wiring, for amplifying a signal received by the receiver; a bypass circuit connected in parallel to the booster; a LAN signal pass circuit disposed in the bypass circuit, for passing LAN signal therethrough but cutting off the signal which is within a frequency range outside the frequency range of the LAN signal; and a plurality of units connected to the utility wiring, for processing a multiple signal transmitted through the utility wiring, wherein each of a plurality of units further comprises a pair of utility wiring connecting terminals connected with each other for connecting to the utility wiring; at least one input-output terminal for connecting a computer, the input-output terminal being connected to the utility wiring connecting terminals; at least one input-output terminal for connecting the receiver, the input-output terminal being connected to the utility wiring connecting terminals; and a first signal interference preventing circuit for preventing a reverse flow of the LAN signal, the circuit being connected between the utility wiring connecting terminals and each input-output terminal for connecting the receiver.

Preferably, in the system, the LAN signal pass circuit comprises a low-pass filter having a cut-off frequency which is within a range of from 50 MHz to 20 MHz.

Preferably, the unit comprises a second signal interference preventing circuit for preventing an interference of the LAN signal output from the computer, the circuit being connected between the utility wiring connecting terminals and each input-output terminal for connecting the computer.

Preferably, the first signal interference preventing circuit comprises a high-pass filter having a cut-off frequency which is within a range of from 76 MHz to 10 MHz. Alternatively, the first signal interference preventing circuit comprises a diode. Preferably, the second signal interference preventing circuit comprises a low-pass filter having a cut-off frequency which is within a range of from 70 MHz to 10 MHz.

BEST MODE FOR CARRYING OUT THE INVENTION

Preferred embodiments of the present invention will be described in detail below with reference to the accompanying drawings.

Figure 1:
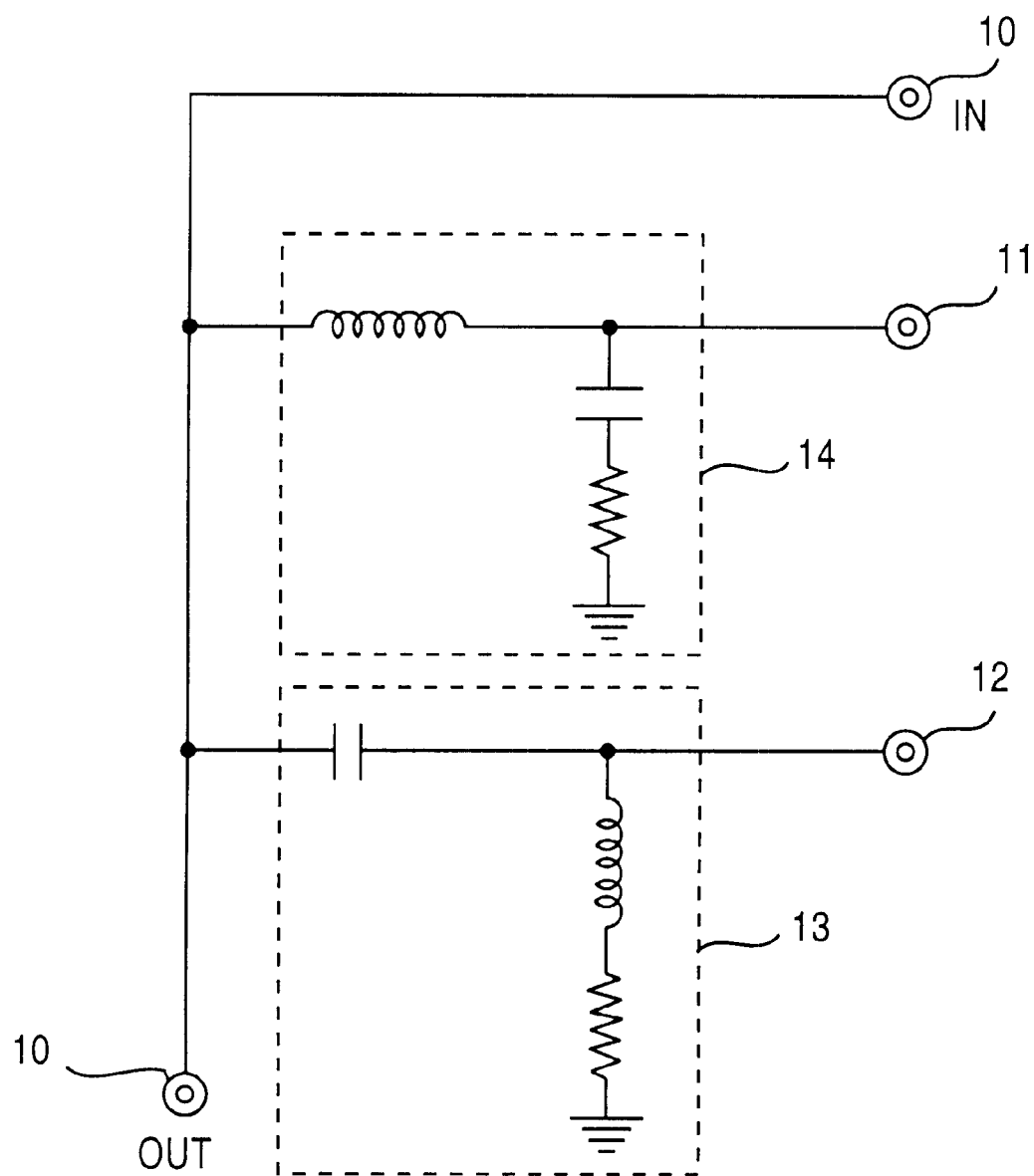
FIG. 1 is a circuit diagram of an embodiment of a multiple signal processing unit for utility wiring by receiver/LAN according to the present invention.

FIG. 1 is a circuit diagram of an embodiment of a multiple signal processing unit for utility wiring by receiver/LAN according to the present invention.

Herein, the receiver means equipment having a function by which a signal can be received from an input terminal. For example, the receiver includes the receiver such as a television, CATV, cable broadcasting, FM broadcasting and in-building broadcasting; and a transmitter/receiver such as a telephone, security communication equipment and an interphone. LAN means a local area network of computers. LAN has standards such as Ethernet (IEEE Standard 802.3), IBM Token ring (IBM Corporation Standard) and Apple talk (Apple Computer Inc., Standard). The utility wiring by receiver/LAN means the utility wiring which is used not only for the receiver but also for LAN. In this case, a type of combination of the receiver and the computer, which are used together, does not have a particular limitation. However, a frequency modulation is needed when a frequency range of the signal received by the receiver overlaps with that of the signal from the computer. The multiple signal means the signal comprising a mix of signals received by the receiver such as the television and the telephone and LAN signal.

As shown in FIG. 1, the multiple signal processing unit for utility wiring by receiver/LAN according to the present invention comprises a pair of utility wiring connecting terminals connected with each other for connecting to the utility wiring by receiver/LAN; at least one (one in this embodiment) input-output terminal 11 for connecting the computer, connected to the utility wiring connecting terminals 10; and at least one (one in this embodiment) input-output terminal 12 for connecting the receiver, connected to the utility wiring connecting terminals 10.

A coaxial cable or a twisted-pair cable can be used as a cable of the utility wiring by receiver/LAN. Preferably, the coaxial cable is used when the long-distance LAN wiring is required. The cable of the standard (JIS 3501) such as 3C, 5C, 7C and 10C for the already-installed television can be used as the coaxial cable. Furthermore, the coaxial cable for the computer, as well as the cable for the television, can be used when a new wiring work is possible such as in a new building. The coaxial cable for the television and the coaxial cable for the computer differ from each other in that they have an impedance of 75Ω and 50Ω, respectively. However, both the coaxial cables can be used for the utility wiring.

The input-output terminal 11 for connecting the computer is not particularly limited. For instance, the network connector such as the Ethernet connector, the IBM Token ring connector and the Apple talk connector can be used as the input-output terminal 11. More preferably, the Ethernet connector is used because it is highly popular and has high general-purpose properties. There are T-type, 2-type, 5-type and F-type Ethernet connectors in standards on the Ethernet connector (IEEE Standard 802.3). In this embodiment, any one of T-type, 2-type, 5-type and F-type Ethernet connectors can be connected to the computer. Alternatively, a plurality of Ethernet connectors of various types may be connected to the computer.

An input-output terminal 12 adapted to the receiver to be used, e.g., the receiver such as the television, CATV, the cable broadcasting, the FM broadcasting and the in-building broadcasting and the transmitter/receiver such as the telephone, the security communication equipment and the interphone, is used. The type and number of the input-output terminal for connecting the receiver to be used are not limited.

A first signal interference preventing circuit for preventing a reverse flow of the LAN signal is connected between the utility wiring connecting terminals 10 and each input-output terminal 12 for connecting the receiver. In this embodiment, the first signal interference preventing circuit comprises a high-pass filter 13. However, a diode or a signal control circuit having an equivalent function to the function of these elements can be also used as the first signal interference preventing circuit. The high-pass filter 13 does not attenuate the frequency higher than a cut-off frequency, while it greatly attenuates the frequency lower than the cut-off frequency. Thereby, the high-pass filter 13 functions so as to cut the signal of the low frequency that is the cut-off frequency or less. In the present invention, preferably, the high-pass filter 13 having the cut-off frequency ranging from 76 MHz to 20 MHz can be used. More preferably, the high-pass filter 13 having the cut-off frequency ranging from 70 MHz to 30 MHz can be used.

A second signal interference preventing circuit for preventing an interference of the LAN signal output from the computer is connected between the utility wiring connecting terminals 10 and each input-output terminal 11 for connecting the computer. In this embodiment, the second signal interference preventing circuit comprises a low-pass filter 14. The low-pass filter 14 does not attenuate the frequency lower than the cut-off frequency, while it greatly attenuates the frequency higher than the cut-off frequency. Thereby, the low-pass filter 14 functions so as to cut the signal in the range of the high frequency that is the cut-off frequency or more. In the present invention, the low-pass filter 14 having the cut-off frequency of 10 MHz or more can be used in order to pass the signal through the frequency range used in Ethernet. Preferably, the low-pass filter 14 having the cut-off frequency of 20 MHz or more is typically used. There is no problem when the upper limit of the cut-off frequency is lower than the mixed frequency range. Desirably, the upper limit is typically 76 MHz or less because the frequency used for the FM broadcasting is 76 MHz or more. Most preferably, the cut-off frequency of the low-pass filter 14 is therefore set at 50 MHz to 20 MHz.

Although the high-pass filter 13 and the low-pass filter 14 arc of various types such as LC-type, RC-type and RCL-type as well known, any type may be used. In this embodiment, the RCL-type is used as both of the high-pass filter 13 and the low-pass filter 14.

Next, a method of operating the unit will be described.

The utility wiring connecting terminals 10 of the unit are connected to the utility wiring by receiver/LAN. In this case, one of the utility wiring connecting terminals 10 is connected to one side of the utility wiring by receiver/LAN so as to serve as an input terminal, while the other of the utility wiring connecting terminals 10 is connected to the other side of the utility wiring by receiver/LAN so as to serve as an output terminal. The multiple signal transmitted through the utility wiring by receiver/LAN is input to the unit through the utility wiring connecting terminals 10. The input multiple signal is supplied to the input-output terminal 11 for connecting the computer and the input-output terminal 12 for connecting the receiver.

For the processing of the multiple signal, it is necessary to prevent the signal received by the receiver and the LAN signal from interfering with each other in order to normally operate all of various receivers and computers connected to the utility wiring. The reason is as follows. Such a mutual interference of the signals causes the attenuation or disappearance of the signal due to the reflection and multiplexing of the signal, or a ghost, a noise or the like. More particularly, the mutual interference of the signals causes two problems. First, an opposite-phase signal is generated due to the reflection of the LAN signal from a signal receiving section of the receiver, thereby resulting in the attenuation or disappearance of the LAN signal in the whole network. Secondly, the LAN signal output from the computer includes the signal which is within the frequency band of the signal received by the receiver, whereby the noise may enter the receiver.

According to the unit of the present invention, the first problem is solved by locating the high-pass filter 13 on the side of the input-output terminal 12 for connecting the receiver. That is, the cut-off frequency of the high-pass filter 13 is set at the frequency which is higher than the frequency of the LAN signal and lower than the frequency of the signal received by the receiver. Thus, the high-pass filter 13 acts as the circuit for preventing the LAN signal from entering the receiver. Consequently, the LAN signal is prevented from entering the receiver, thereby preventing the LAN signal from reflecting from the receiver.

According to the unit of the present invention, the second problem is solved by locating the low-pass filter 14 on the side of the input-output terminal 11 for connecting the computer. That is, the cut-off frequency of the low-pass filter 14 is set at the frequency which is higher than the frequency of the LAN signal and lower than the frequency of the signal received by the receiver. Therefore, the LAN signal flows through only the input-output terminal for connecting the computer by the action of the low-pass filter 14 combined with the action of the high-pass filter 13 located on the side of the input-output terminal 12 for connecting the receiver. As a result, the noise is prevented from entering the receiver.

According to the present invention, the signal received by the receiver and the LAN signal can be thus transmitted through a single cable without their mutual interference. Accordingly, LAN can be constructed by the use of the wiring of the cable for the receiver only such as the existing television.

Moreover, the multiple signal processing unit for utility wiring by receiver/LAN according to the present invention can be used in various forms such as a wall-surface module, a single unit or a circuit or unit contained in the receiver. Thus, the unit has very high general-purpose properties. More specifically, the wall-surface module is useful because it can be very easily installed in a saved space only by replacing an existing module with it.

Figure 2:
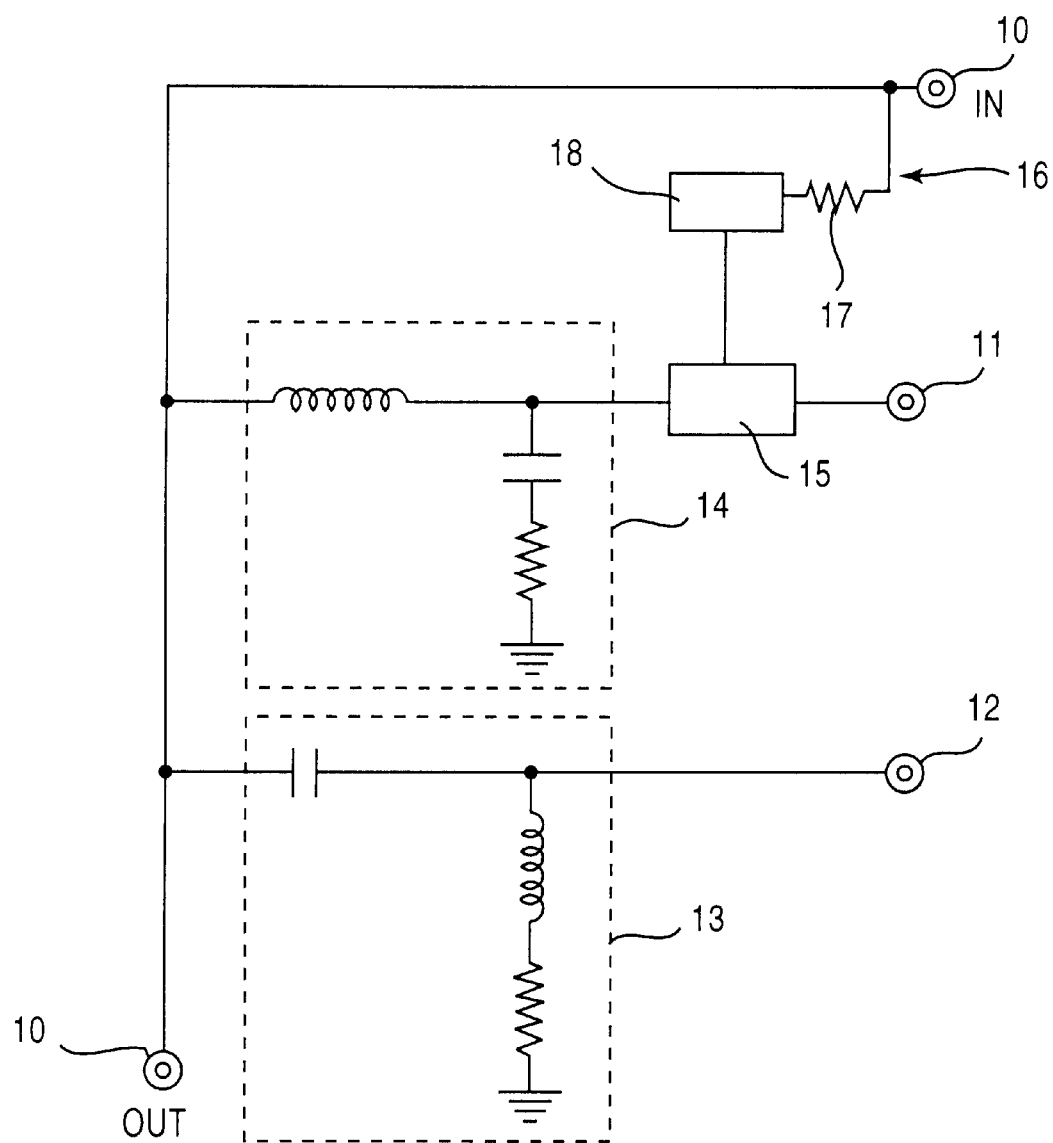
FIG. 2 is a circuit diagram of the unit of FIG. 1 which is adapted so as to supply a power from the utility wiring by receiver/LAN.

A signal conversion circuit is not needed when 2-type Ethernet connector is used as the input-output terminal 11 for connecting the computer. However, the signal conversion circuit is needed when the other Ethernet connectors such as T-type, 5-type and F-type Ethernet connectors are used as the input-output terminal 11. Preferably, a signal conversion circuit 15 is connected between the low-pass filter 14 and the input-output terminal 11 for connecting the computer, as shown in FIG. 2. The signal processing requires a power supply. This power can be supplied from the utility wiring by receiver/LAN. A commercially available DC power supply insertion unit, for example, PES-1500 (DX Antenna) can be used as the power supply. In order to obtain the power supply from the utility wiring by receiver/LAN, a power supply bypass 16 is extended from the utility wiring connecting terminals 10 so as to supply the power to the signal conversion circuit 15. Preferably, a resistance 17 or the lie and a voltage conversion circuit 18 are disposed in the power supply bypass 16 in order to prevent the mixed signal from attenuating, as needed.

Figure 3:
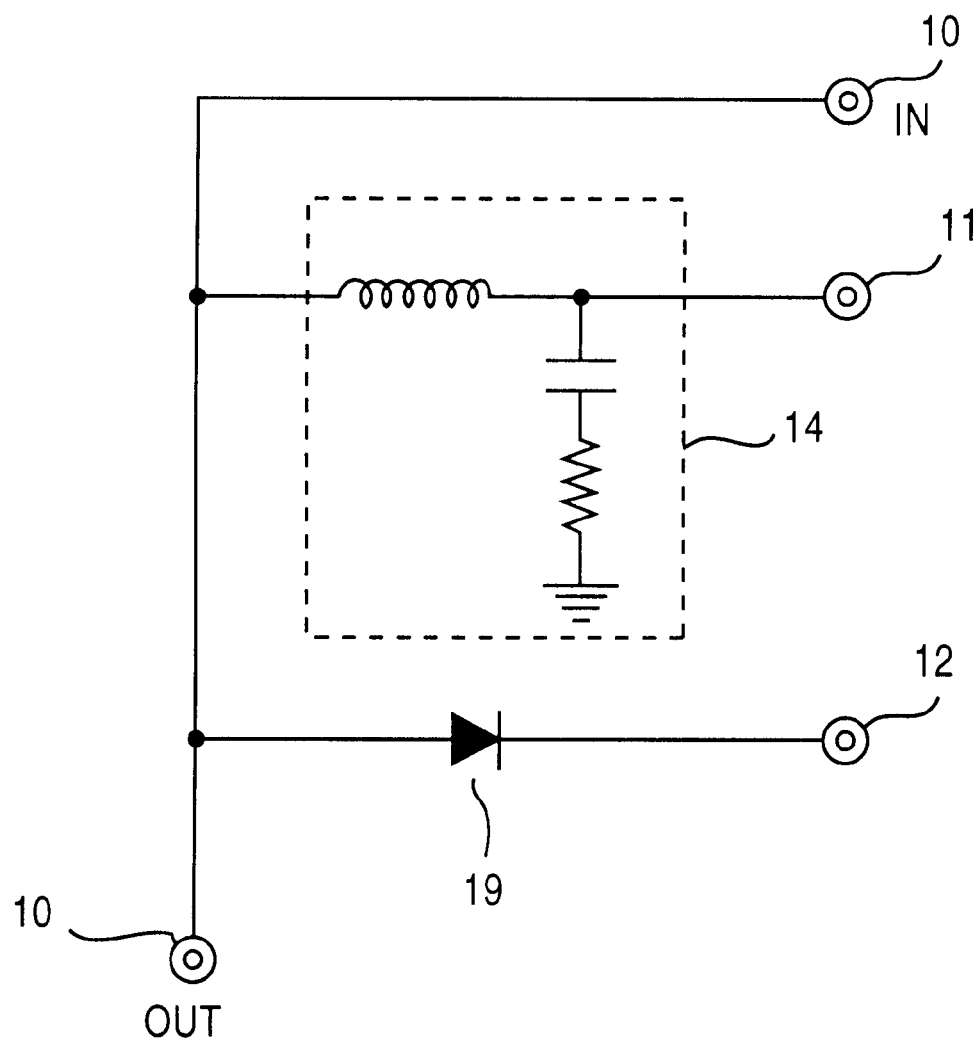
FIG. 3 is a circuit diagram of another embodiment of the multiple signal processing unit for utility wiring by receiver/LAN according to the present invention.

FIG. 3 is a circuit diagram of another embodiment of the multiple signal processing unit for utility wiring by receiver/LAN according to the present invention. In this embodiment, the first signal interference preventing circuit comprises a diode 19. The second signal interference preventing circuit comprises the RCL-type low-pass filter 14 in the same manner as the embodiment of FIG. 1.

Zener diode, a rectifier diode, a light emitting diode, PNP transistor, NPN transistor, FET transistor or the tic can be used as the diode 19.

In this case, the diode 19 functions as a LAN signal reverse flow preventing circuit for preventing the passing of the LAN signal reflected from the receiver. The diode 19 has the same effect as the high-pass filter 13 of the embodiment of FIG. 1.

The embodiment of FIG. 3 obtains the same function and effect as the embodiment of FIG. 1.

The first signal interference preventing circuit of the multiple signal processing unit for utility wiring by receiver/LAN according to the present invention is not limited to the above embodiments. For example, a capacitor can be used as the first signal interference preventing circuit.

Figure 4:
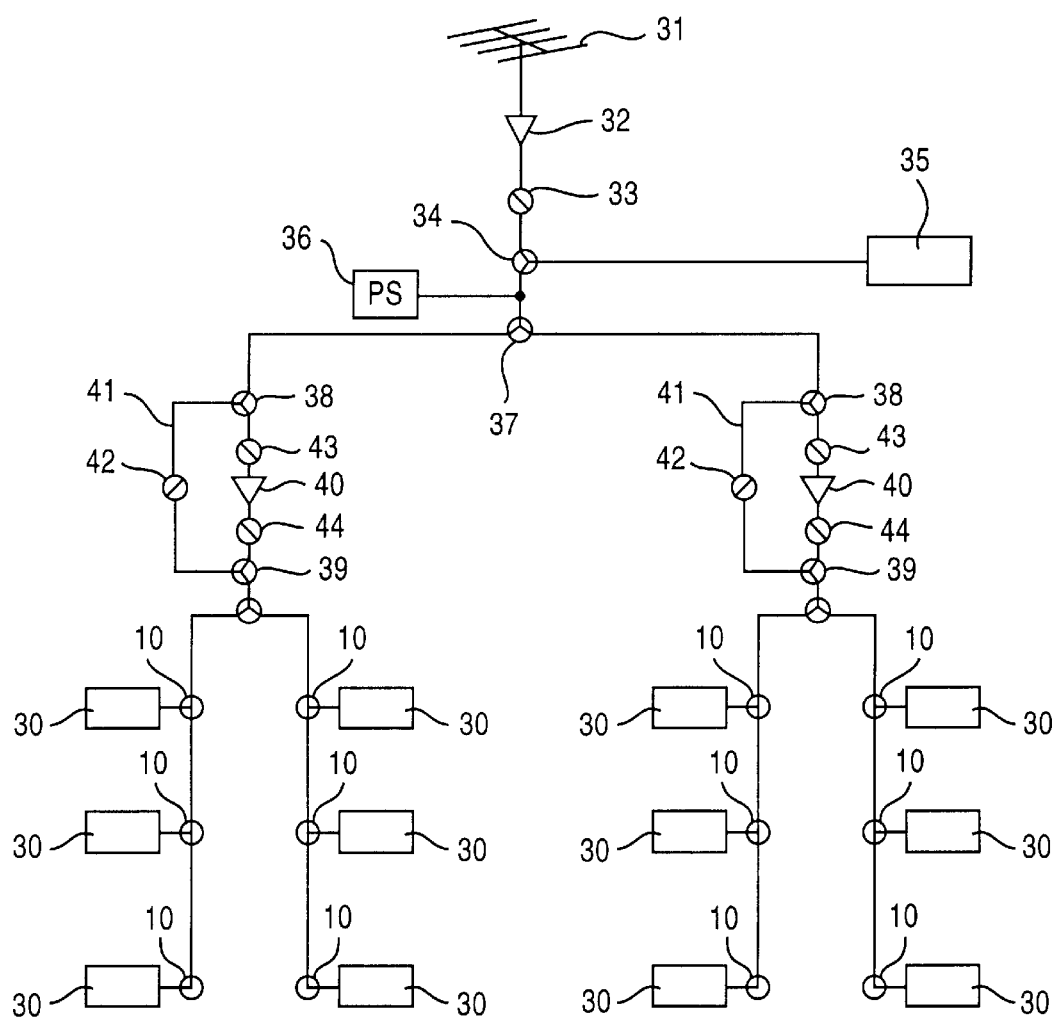
FIG. 4 is a circuit diagram showing a constitution of an embodiment of a utility wiring system by receiver/LAN in which the multiple signal processing unit for utility wiring by receiver/LAN according to the present invention is applied to interior wiring of a coaxial cable for a television receiver.

FIG. 4 is a circuit diagram showing a constitution of an embodiment of a utility wiring system by receiver/LAN in which the multiple signal processing unit for utility wiring by receiver/LAN according to the present invention is applied to interior wiring of the coaxial cable for the television receiver.

In FIG. 4, a multiple signal processing unit 30 for utility wiring by receiver/LAN according to the present invention (the unit of the embodiment of FIG. 2 in this embodiment) is installed in each room. The utility wiring connecting terminals 10 of the unit 30 are connected to the coaxial cable.

A television signal is input from an antenna 31 and amplified by a head booster 32. Then, the signal passes through a high-pass filter 33 so that the lower frequency range thereof is cut. The signals received by other than the antenna, such as the cable broadcasting, pass through a signal mixer/distributor 34 so that they are mixed. In the drawing, numeral 35 denotes a transmitter for transmitting the signals other than the television signal. Numeral 36 denotes a DC power supply insertion unit.

The television signal is equally distributed by a signal mixer/distributor 37 and then transmitted toward a line booster 40. Signal mixers/distributors 38 and 39 are arranged before and after the line booster 40, respectively. A bypass 41 for connecting the signal mixers/distributors 38 and 39 is formed. A low-pass filter 42 is located in the bypass 41. High-pass filters 43 and 44 are connected between the line booster 40 and the signal mixer/distributor 38 and between the line booster 40 and the signal mixer/distributor 39, respectively. In this case, either the high-pass filter 43 or 44 may be eliminated.

The television signal cannot pass through the bypass 41 due to the action of the low-pass filter 42. However, the television signal can pass through the line booster 40 by the action of the high-pass filters 43 and 44. The television signal is amplified by the line booster 40. Then, the television signal passes through the signal mixer/distributor 39. The television signal is then supplied in series or in parallel to each multiple signal processing unit 30 according to the present invention. Referring again to FIG. 2, the television signal supplied to the multiple signal processing unit 30 is input from the utility wiring connecting terminals 10 through the high-pass filter 13 to the input-output terminal 12 for connecting the receiver. Then, the television signal is supplied to the television receiver connected to the terminal 12.

In FIG. 2, the LAN signal output from the computer is input from the input-output terminal 11 for connecting the computer of each unit 30. Then, the LAN signal passes through the signal conversion circuit 15 and the low-pass filter 14. The LAN signal is supplied to the coaxial cable through the utility wiring connecting terminals 10. The LAN signal is mixed with the television signal. Referring again to FIG. 4, the LAN signal is transmitted in two directions through the coaxial cable. In this case, the LAN signal cannot pass through the line booster 40 due to the high-pass filters 43 and 44. However, the action of the low-pass filter 42 allows the LAN signal to enter the bypass 41 from one signal mixer/distributor 38, for example. Then, the LAN signal is again mixed with the television signal by the other signal mixer/distributor 39. The LAN signal is then transmitted through the coaxial cable. This multiple signal is supplied to each unit 30 according to the present invention. Referring again to FIG. 2, the LAN signal supplied to the unit 30 is input from the utility wiring connecting terminals 10 to the input-output terminal 11 for connecting the computer via the signal conversion circuit 15 and the low-pass filter 14. Then, the LAN signal is supplied to the computer connected to the terminal 11.

Preferably, the booster is located in order to restore the attenuation of the television signal in the case of the long wiring for LAN, i.e., the long wiring of the coaxial cable for the television and many connectors. In this case, the normal booster does not pass the LAN signal therethrough. Thus, the bypass is needed for the booster. However, the bypass may double a transmission path of the television signal and thus shift a phase of the television signal, thereby causing the ghost or echo. In order to avoid this, the circuit for attenuating or cutting the television signal, e.g., the same low-pass filter as described above is desirably installed in the bypass. This bypass is necessary when the LAN path includes the booster for cutting off or attenuating the LAN signal or the signal mixer/distributor. A signal pass booster or the signal mixer/distributor may be used instead of the bypass.

According to the present invention, the signal received by the television and the LAN signal can be transmitted through the television coaxial cable which is already wired in the building, without causing interference between the signals whereby the construction at can can be achieved by utilizing the cable already wired in the building.

POSSIBILITY OF INDUSTRIAL UTILIZATION

As described above, according to the present invention, the signal received by the receiver such as the television and the LAN signal can be transmitted through the television coaxial cable or the like which is wired in the existing building, without their mutual interference. As a result, the wiring of the cable for the computer only is not needed for the construction of LAN. Thus, the cost and the construction period can be greatly reduced. Furthermore, the wiring of the coaxial cable for the television etc. allows the construction of LAN even in the building, the place or the like in which LAN cannot be, in fact, constructed.

What is claimed is:

1. A utility wiring system by receiver/LAN comprising:
   a utility wiring by receiver/LAN;
   at least one booster (40) located in said utility wiring, for amplifying a signal received by the receiver;
   a bypass circuit (41) connected in parallel to said booster (40);
   a LAN signal pass circuit disposed in said bypass circuit (41), for passing LAN signal therethrough but cutting off the signal which is within a frequency range outside the frequency range of the LAN signal; and
   a plurality of units (30) connected to said utility wiring, for processing multiple signals transmitted through said utility wiring,
   wherein each of said plurality of units (30) further comprises:
      a pair of utility wiring connecting terminals (10) connected with each other for connecting to said utility wiring;

at least one input-output terminal (11) for connecting a computer, said input-output terminal (11) being connected to said utility wiring connected to said utility wiring connecting terminals (10);

at least one input-output terminal (12) for connecting the receiver, said input-output terminal (12) being connected to said utility wiring connecting terminals (10); and a first signal interference preventing circuit for preventing a reverse flow of the LAN signal, said circuit being connected between said utility wiring connecting terminals (10) and said each input-output terminal 12 for connecting the receiver.

2. The system according to claim 1, wherein said LAN signal pass circuit comprises a low-pass filter having a cut-off frequency which is within a range of from 50 MHz to 20 MHz.

3. The system according to claim 2, wherein said unit (30) comprises a second signal interference preventing circuit for preventing an interference of the LAN signal output from the computer, said circuit being connected between said utility wiring connecting terminals (10) and said each input-output terminal (11) for connecting the computer.

4. The system according to claim 2, wherein said first signal interference prevent circuit comprises a high-pass filter (13) having a cut-off frequency which is within a range of from 76 MHz to 10 MHz.

5. The system according to claim 2, wherein said first signal interference prevent circuit comprises a diode (19).

6. The system according to claim 3, wherein said second signal interference preventing circuit comprises a low-pass filter (14) having a cut-off frequency which is within a range of from 70 MHz to 10 MHz.

* * * * *